(12) United States Patent
Kim et al.

(10) Patent No.: US 10,566,475 B2
(45) Date of Patent: Feb. 18, 2020

(54) HIGH-EFFICIENCY PHOTOELECTRIC ELEMENT AND METHOD FOR MANUFACTURING SAME

(71) Applicant: INCHEON UNIVERSITY INDUSTRY ACADEMIC COOPERATION FOUNDATION, Incheon (KR)

(72) Inventors: Joondong Kim, Incheon (KR); Ju-Hyung Yun, Seoul (KR)

(73) Assignee: Icheon University Industry Academic Cooperation Foundation, Incheon (KR)

( * ) Notice: Subject to any disclaimer, the term of this patent is extended or adjusted under 35 U.S.C. 154(b) by 75 days.

(21) Appl. No.: 15/117,830

(22) PCT Filed: Jul. 3, 2014

(86) PCT No.: PCT/KR2014/005951
§ 371 (c)(1),
(2) Date: Aug. 10, 2016

(87) PCT Pub. No.: WO2015/122581
PCT Pub. Date: Aug. 20, 2015

(65) Prior Publication Data
US 2016/0372614 A1 Dec. 22, 2016

(30) Foreign Application Priority Data
Feb. 13, 2014 (KR) ........................ 10-2014-0016643

(51) Int. Cl.
*H01L 31/0224* (2006.01)
*H01L 31/054* (2014.01)
(Continued)

(52) U.S. Cl.
CPC ............... *H01L 31/022466* (2013.01); *H01L 31/02167* (2013.01); *H01L 31/02168* (2013.01);
(Continued)

(58) Field of Classification Search
CPC . H01L 31/02; H01L 31/0216; H01L 31/0224; H01L 31/022425;
(Continued)

(56) References Cited

U.S. PATENT DOCUMENTS 8,698,267 B2   4/2014 Wang et al.
9,177,984 B2 * 11/2015 Izuha ................ H01L 27/14621
(Continued)

FOREIGN PATENT DOCUMENTS

EP           2474843 A1 *  7/2012  ............... B32B 3/30
KR    10-2007-0062516 A    6/2007
(Continued)

OTHER PUBLICATIONS

International Search Report issued in PCT/KR2014/005951 dated Nov. 28, 2014 (5 pages).

*Primary Examiner* — Susan D Leong
(74) *Attorney, Agent, or Firm* — RatnerPrestia

(57) ABSTRACT

The present invention relates to a photoelectric element and a method for manufacturing the same, and the photoelectric element according to the present invention includes: a semiconductor substrate; and transparent conductor pattern portions formed on a surface of the semiconductor substrate to be connected to each other with a specific cycle such that incident light is concentrated in a specific area of the semiconductor substrate.

9 Claims, 17 Drawing Sheets

(51) Int. Cl.
*H01L 31/0236* (2006.01)
*H01L 31/0216* (2014.01)
*H01L 31/18* (2006.01)

(52) U.S. Cl.
CPC ...... *H01L 31/0543* (2014.12); *H01L 31/1884* (2013.01); *Y02E 10/52* (2013.01)

(58) Field of Classification Search
CPC ......... H01L 31/022466; H01L 31/0232; H01L 31/0236; H01L 31/04; H01L 31/0445
See application file for complete search history.

(56) References Cited

U.S. PATENT DOCUMENTS

| | | | | |
|---|---|---|---|---|
| 2005/0270406 A1* | 12/2005 | Fukunaga | ......... | H01L 27/14634 348/342 |
| 2007/0128905 A1* | 6/2007 | Speakman | ........... | H05K 1/0265 439/161 |
| 2008/0047600 A1* | 2/2008 | Ohashi | .............. | H01L 31/03529 136/255 |
| 2011/0240104 A1* | 10/2011 | Lee | ................... | H01L 31/02167 136/252 |
| 2013/0213477 A1* | 8/2013 | Nakayama | ............ | H01L 51/447 136/263 |
| 2013/0298399 A1* | 11/2013 | Trigwell | ......... | H01L 31/022466 29/846 |
| 2014/0306263 A1 | 10/2014 | Garbar et al. | | |
| 2014/0327862 A1* | 11/2014 | Hatsusaka | .......... | C09K 19/0225 349/100 |
| 2015/0122304 A1* | 5/2015 | Moon | ................... | B82Y 10/00 136/244 |

FOREIGN PATENT DOCUMENTS

| | | |
|---|---|---|
| KR | 10-2010-0016182 A | 2/2010 |
| KR | 2010-0098448 A | 9/2010 |
| KR | 2014-0001729 A | 1/2014 |

* cited by examiner

HIGH-EFFICIENCY PHOTOELECTRIC ELEMENT AND METHOD FOR MANUFACTURING SAME

CROSS REFERENCE TO RELATED APPLICATIONS

This application is the U.S. National Phase Application of PCT/KR2014/005951, filed Jul. 3, 2014, which claims priority to Korean Patent Application No. 10-2014-0016643, filed Feb. 13, 2014, the contents of such applications being incorporated by reference herein.

TECHNICAL FIELD

The present inventive concept relates to a photoelectric element and a method for manufacturing the same, and more particularly, to a photoelectric element having superior light efficiency and electrical properties and a method for manufacturing the photoelectric element.

BACKGROUND ART

With the growing interest in environmental problems and energy depletion, solar energy is drawing increasing attention as alternative energy that is abundant, free from problems of environmental contamination, and highly efficient.

Solar energy may be classified into solar thermal cells that generate vapor necessary for rotating a turbine using solar heat and into photovoltaic cells that convert sunlight into electric energy using the properties of a semiconductor.

To form a photovoltaic cell, a photoelectric element that converts light into electricity is essential. A photodiode, a type of photoelectric element, uses mono-crystals such as silicon (Si) or gallium arsenide phosphide (GaAsP) and uses a PN junction or a PIN junction.

For the photodiode, it is very important to increase the efficiency of converting incident sunlight into electric energy is very important. Therefore, research is being continuously conducted on the structure and material of the photodiode.

DISCLOSURE

Technical Problem

Aspects of the inventive concept provide a photoelectric element which solves the foregoing problems and has improved conversion efficiency.

Aspects of the inventive concept also provide a method for manufacturing a photoelectric element which solves the foregoing problems and has improved conversion efficiency.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

Technical Solution

According to an aspect of the inventive concept, there is provided a photoelectric element comprising a semiconductor substrate and transparent conductor pattern portions formed on a surface of the semiconductor substrate to be connected to each other with a specific period such that incident light is concentrated in a specific area of the semiconductor substrate.

According to another aspect of the inventive concept, there is a method for manufacturing a photoelectric element, the method comprising forming photocurable resin on a surface of a semiconductor substrate, forming hole patterns by pressing a mold against the photocurable resin and curing the photocurable resin, forming transparent conductor patterns on the semiconductor substrate through the hole patterns, removing the photocurable resin and forming a transparent conductor coating on the transparent conductor patterns.

Advantageous Effects

An embodiment of the inventive concept provides at least one of the following advantages.

That is, a photoelectric element according to an embodiment enables more photons of incident light to reach more deeply into silicon.

In addition, a photoelectric element according to an embodiment can increase its conversion efficiency by reducing the reflectance of incident light.

Further, a photoelectric element of the inventive concept can increase its conversion efficiency by adjusting a focal length of visible light.

However, the effects of the inventive concept are not restricted to the one set forth herein. The above and other effects of the inventive concept will become more apparent to one of daily skill in the art to which the inventive concept pertains by referencing the claims.

DETAILED DESCRIPTION

Figure 1:
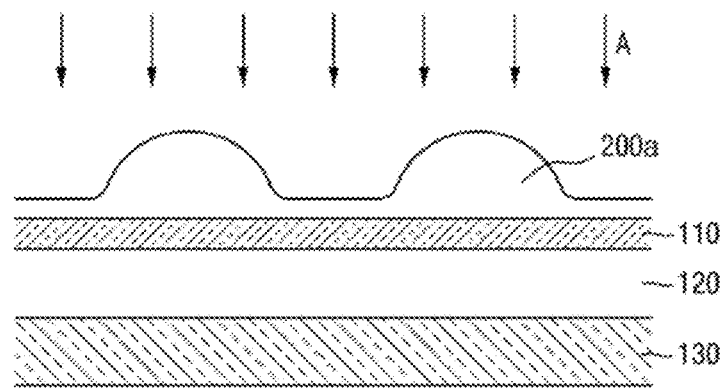
FIG. 1 is a conceptual diagram illustrating the structure of a photoelectric element according to an embodiment.

The present inventive concept will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Photoelectric elements according to embodiments will now be described with reference to FIGS. 1 through 4.

Figure 2:
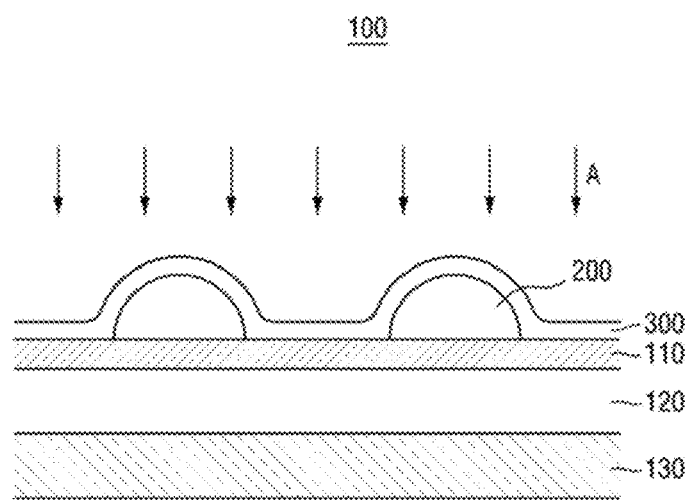
FIG. 2 is a conceptual diagram illustrating the structure of a photoelectric element according to an embodiment.
Figure 3:
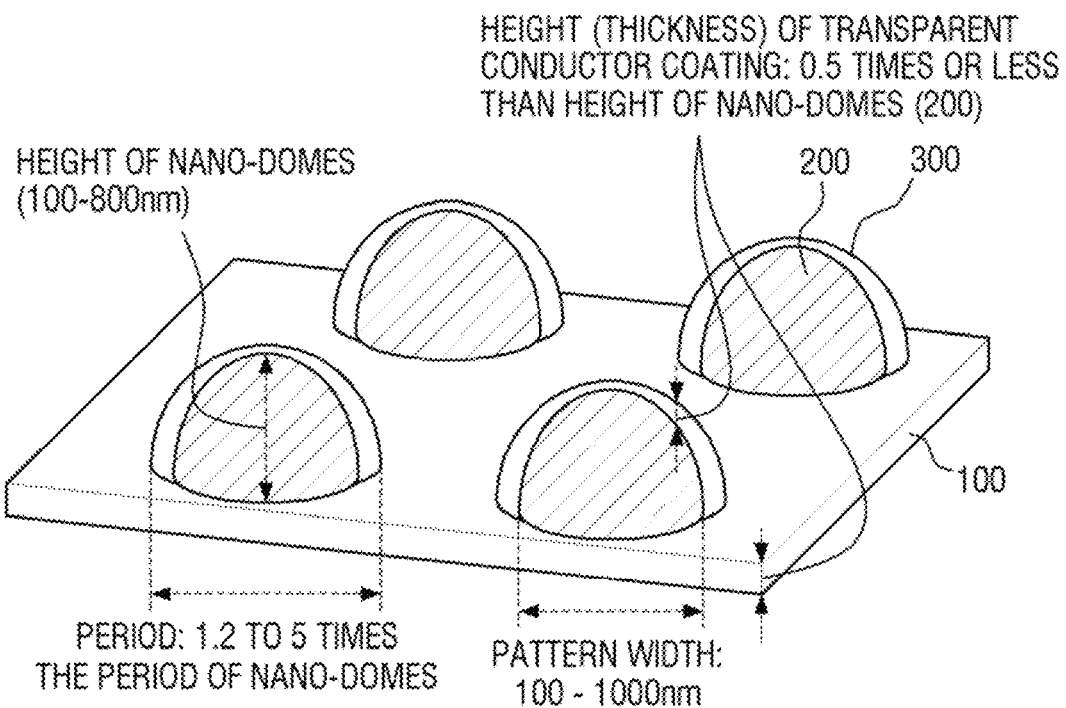
FIG. 3 is a perspective view illustrating the scale of the photoelectric element of FIG. 2.
Figure 4:
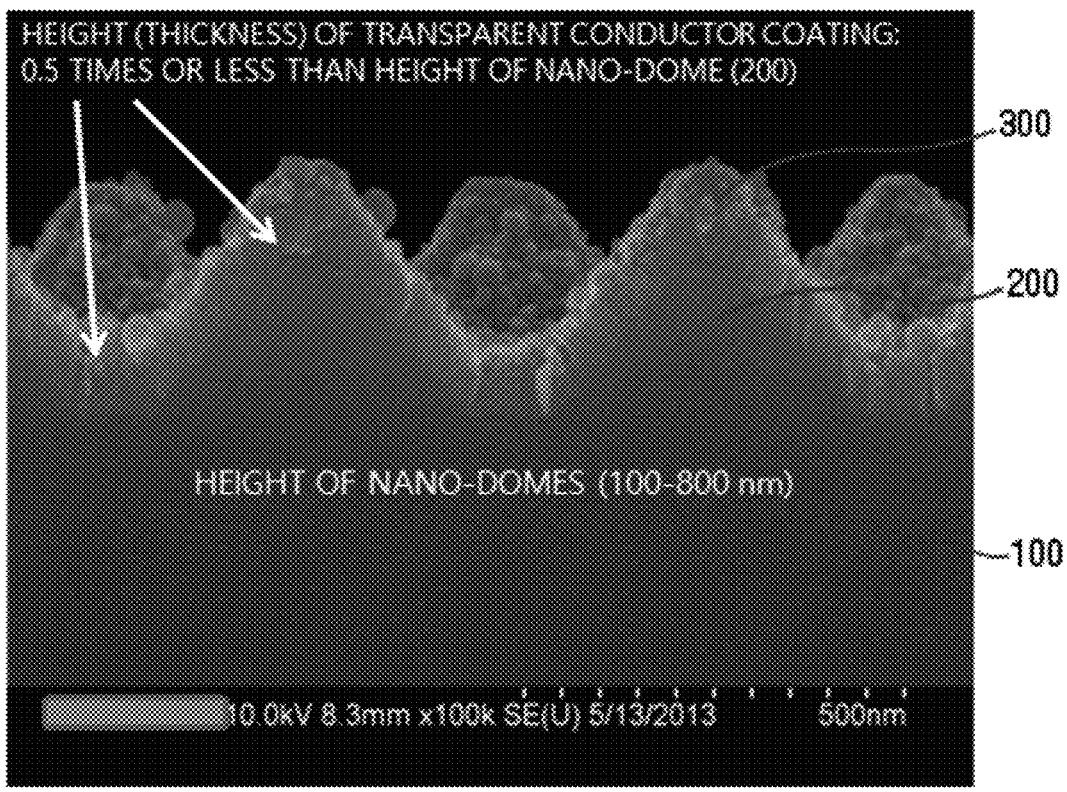
FIG. 4 is a side image of the photoelectric element of FIG. 2 observed through a microscope.

FIG. 1 is a conceptual diagram illustrating the structure of a photoelectric element according to an embodiment. FIG. 2 is a conceptual diagram illustrating the structure of a photoelectric element according to an embodiment. FIG. 3 is a perspective view illustrating the scale of the photoelectric element of FIG. 2. FIG. 4 is a perspective image and a side image of the photoelectric element of FIG. 2 observed through a microscope.

Referring to FIG. 1, the photoelectric element according to the embodiment includes a semiconductor substrate 100 and transparent conductor pattern portions 200a.

Specifically, the semiconductor substrate 100 may include at least one of silicon (Si), germanium (Ge), and gallium arsenide (GaAs). The semiconductor substrate 100 may include a first conductivity type region 130. The first conductivity type region 130 may be a p-type region or an n-type region.

The semiconductor substrate 100 may include a second conductivity type region 110. The second conductivity may be different from the first conductivity type. For example, the second conductivity type may be, but is not limited to, an n-type or a p-type and opposite to the first conductivity type. The semiconductor substrate 100 may also use a heterojunction instead of a PN junction. When the semiconductor substrate 100 uses the heterojunction, the second conductivity type region 110 may not exist.

The first conductivity type region 130 and the second conductivity type region 110 of the semiconductor substrate 100 may form a PN junction. A depletion layer 120 may exist between the first conductivity type region 130 and the second conductivity type region 110. The depletion layer 120 may be a region formed at a PN junction interface. Thus, carriers (electrons or holes) may not exist in the depletion layer 120.

Electrons may exist asymmetrically in the first conductivity type region 130 and the second conductivity type region 110 of the semiconductor substrate 100 of the photoelectric element. In thermal equilibrium, carrier diffusion due to a concentration gradient of carriers causes an imbalance in electric charge in the semiconductor substrate 100 formed by the junction of the first conductivity type region 130 and the second conductivity type region 110, resulting in the formation of an electric field.

Therefore, when light having a greater energy than a band gap energy, which is an energy gap between a conduction band and a valence band of a material that forms the semiconductor substrate 100, is irradiated onto the semiconductor substrate 100, electrons receiving the light energy may be excited from the valence band to the conduction band, and the electrons excited to the conduction band may move freely.

In addition, holes are generated in portions of the valence band from which the electrons moved out.

The free electrons and the holes generated as described above are called "excess carriers," and the excess carriers are diffused by a concentration difference in the conduction band or the valence band.

Here, the excess carriers, that is, electrons excited in a p-type region and holes generated in an n-type region are defined as minority carriers, and carriers (i.e., p-type holes and n-type electrons) in an n-type or p-type semiconductor layer before the junction are defined as majority carriers.

Here, the flow of the majority carriers is hindered by an energy barrier due to an electric field, but electrons which are minority carriers in the p-type region can move to the n-type region.

Therefore, the diffusion of the minority carriers causes a potential difference within the semiconductor substrate 100, and an electromotive force can be utilized by connecting electrodes located on both sides of the semiconductor substrate 100 to an external circuit. Hence, the semiconductor substrate 100 can be used as a battery.

Accordingly, a lot of light is incident into the photoelectric element, and light absorptivity of a solar cell can be increased by improving the path of the incident light, thereby improving energy conversion efficiency. This increases the potential difference within the semiconductor substrate, which, in turn, improves the efficiency of the solar cell.

Unlike the above description, a PN junction which is a homogeneous junction may cause a significant loss of carriers due to the recombination of the carriers. On the other hand, a heterojunction without a doping process may reduce the loss of the carriers. Further, a transparent conductor such as indium tin oxide (ITO) has superior electrical conductivity and superior light-transmitting properties. Therefore, the transparent conductor is frequently used as a heterojunction element.

The transparent conductor pattern portions 200a may be formed on a surface of the semiconductor substrate 100. The transparent conductor pattern portions 220a may be patterned with a specific period. The transparent conductor pattern portions 200a may be connected to each other by patterns with a period. As illustrated in the drawing, the transparent conductor pattern portions 200a may include convex patterns with a specific period, and the convex pattern portions may be connected to each other by concave portions.

The transparent conductor pattern portions 200a may be made of a different material from the semiconductor substrate 100. While the semiconductor substrate 100 includes at least one of Si, Ge and GaAs, the transparent conductor pattern portions 200a may be conductors made of a transparent material that can pass visible light. For example, the transparent conductor pattern portions 200a may be, but are not limited to, tin oxide, indium oxide, platinum (Pt), gold (Au), indium zinc oxide (IZO), or ITO.

When the heterojunction is used, electrons exist asymmetrically in the semiconductor substrate 100 and the transparent conductor pattern portions 200a. In thermal equilibrium, carrier diffusion due to a concentration gradient of carriers causes an imbalance in electric charge in a diode region formed by the junction of the transparent conductor pattern portions 200a and the semiconductor substrate 100, resulting in the formation of an electric field.

Therefore, when light having a greater energy than a band gap energy, which is an energy gap between a conduction band and a valence band of a material that forms the diode region, is irradiated into the diode region, electrons receiving the light energy may be excited from the valence band to the conduction band, and the electrons excited to the conduction band may move freely.

Specifically, since the transparent conductor pattern portions 200a can transmit light, un-reflected light may reach the semiconductor substrate 100. Electrons excited by the light reaching the semiconductor substrate 100 can easily move to the transparent conductor pattern portions 200a by a difference in resistivity in the semiconductor substrate 100.

For example, if the semiconductor substrate 100 is made of p-type silicon, it may have a resistivity of about 1 to 10 $\Omega$cm. If the transparent conductor pattern portions 200a are made of ITO, they may have a resistivity of about $9.90 \times 10^{-5}$ $\Omega$cm, which is a tiny value compared with the resistivity of the p-type silicon.

Accordingly, the excited electrons can easily move to the less resistant transparent conductor pattern portions 200a. Therefore, a plurality of electrons moves from the semiconductor substrate 100 to the transparent conductor pattern portions 200a.

Therefore, the diffusion of the excited electrons causes a potential difference within the diode region, and an electromotive force can be utilized by connecting a first electrode 300 and a second electrode 400 located on both sides of the diode region to an external circuit. Therefore, the photoelectric element of the current embodiment can be used as a solar cell.

Referring to FIGS. 2 through 4, transparent conductor pattern portions 200a may include transparent conductor patterns 200 and a transparent conductor coating 300. However, the structure of the transparent conductor pattern portions 200a is not limited to this example, and the transparent conductor pattern portions 200a can also exist as a single piece.

The transparent conductor patterns 200 may be formed on a surface of a semiconductor substrate 100. The transparent conductor patterns 200 may be patterns with a specific period. The transparent conductor patterns 200 may be isolated from each other at intervals of a specific period. That is, the transparent conductor patterns 200 may be formed on the semiconductor substrate 100 in the shape of a plurality of islands.

The transparent conductor patterns 200 may be made of a different material from the semiconductor substrate 100. While the semiconductor substrate 100 includes at least one of Si, Ge and GaAs, the transparent conductor patterns 200 may be conductors made of a transparent material that can pass visible light. For example, the transparent conductor patterns 200 may be, but are not limited to, tin oxide, indium oxide, Pt, Au, IZO, or ITO.

A cross-sectional shape of the transparent conductor patterns 200 is not limited to a particular shape but may be, for example, a semicircular shape, an oval shape, a trapezoidal shape, or a triangular shape. In particular, the transparent conductor patterns 200 may have a semicircular shape, that is, may become gradually narrower from the bottom toward the top in order to reduce light reflectance.

A horizontal cross-sectional shape of the transparent conductor patterns 200 is not limited to a particular shape and may be, for example, a circular shape or a polygonal shape. The term "polygonal shape" encompasses all of a triangular shape, a quadrilateral shape, a pentagonal shape, a hexagonal shape, a heptagonal shape, an octagonal shape, etc. Each side of the polygonal shape may or may not be equal. The polygonal shape may be a circular shape in order to prevent light reflectance from being dependent on direction.

The transparent conductor patterns 200 can be arranged in any form as long as they are a plurality of patterns with a specific period. In an example, the transparent conductor patterns 200 may be arranged in a matrix form. Here, a period in an x-axis direction and a period in a y-axis direction may be the same or different. When the transparent conductor patterns 200 are arranged in a matrix form, a maximum of eight transparent conductor patterns 200 can be placed adjacent to one transparent conductor pattern 200.

For example, when the period in the x-axis direction and the period in the y-axis direction are the same, four transparent conductor patterns 200 adjacent to one transparent conductor pattern 200 in the axis directions are located at equal distances from the one transparent conductor pattern 200, and four transparent conductor patterns 200 located diagonally to the axis directions are at equal distances from the one transparent conductor pattern 200 and are located further away from the one transparent conductor pattern 200 than the transparent conductor patterns 200 adjacent to the one transparent conductor pattern 200 in the axis directions.

A width of the transparent conductor patterns 200 is not limited to a particular width but may be in the range of, e.g., 100 to 1000 nm. The transparent conductor patterns 200 having a width of less than 100 nm are difficult to manufacture. In addition, the transparent conductor patterns 200 having a too small width may reduce the light control capability of the photoelectric element, thus increasing a light scattering effect rather than a light focusing effect. Therefore, the width of the transparent conductor patterns 200 may be 100 nm or more. In addition, the transparent conductor patterns 200 having a width of more than 100 nm can degrade the light control capability of the photoelectric element.

A height of the transparent conductor patterns 200 is not limited to a particular height but may be in the range of, e.g., 100 to 800 nm. The transparent conductor patterns 200 having a height of less than 100 nm are undesirable due to insufficient electrical conductivity. In addition, the transparent conductor patterns 200 having a height of more than 800 nm are undesirable due to low transmittance of incident light.

A period of the transparent conductor patterns 200 denotes a cycle at which the transparent conductor pattern 200 is repeatedly formed. The period also denotes a distance between central axes of adjacent transparent conductor patterns 200. Therefore, the period of the transparent conductor patterns 200 is greater than the width of the transparent conductor patterns 200.

Specifically, since the transparent conductor patterns 200 are isolated from each other, the period of the transparent conductor patterns 200 should be greater than the width of the transparent conductor patterns 200. This is because the transparent conductor patterns 200 cannot be isolated from each other when the width of the transparent conductor patterns 200 is greater than the period of the transparent conductor patterns 200.

The period of the transparent conductor patterns 200 is not limited to a particular period but may be in the range of 1.2 to 5 times the width of the transparent conductor patterns 200. When the period of the transparent conductor patterns 200 is less than 1.2 times the width of the transparent conductor patterns 200, the transparent conductor patterns 200 isolated from each other can contact each other due to a cause related to a process. This can cause a structural problem and reduce the reliability of the photoelectric element. In addition, when the period of the transparent conductor patterns 200 is more than 5 times the width of the transparent conductor patterns 200, the efficiency versus area of the photoelectric element can be reduced.

The transparent conductor coating 300 may be formed on the transparent conductor patterns 200. The transparent conductor coating 300 may be made of, but not limited to, the same material as the transparent conductor patterns 200. The transparent conductor coating 300 may be a conductor made of a transparent material that can pass visible light. For example, the transparent conductor coating 300 may be, but is not limited to, tin oxide, indium oxide, Pt, Au, IZO, or ITO.

The transparent conductor coating 300 and the transparent conductor patterns 200 can also be made of different materials. Both the transparent conductor coating 300 and the transparent conductor patterns 200 should have electrical conductivity and light-transmitting properties on the semiconductor substrate 100. However, a material having superior light-transmitting properties may be advantageous to the transparent conductor patterns 200, and a material having excellent electrical conductivity may be advantageous to the coating layer 300. Therefore, the conductor coating 300 and the transparent conductor patterns 200 can be made of the same or different materials based on the assumption that at least a minimum level of electrical conductivity and light-transmitting properties is secured for the conductor coating 300 and the transparent conductor patterns 200.

The transparent conductor coating 300 may electrically connect the transparent conductor patterns 200 isolated from each other. Since the transparent conductor coating, 300 is formed on the semiconductor substrate 100 as a single piece, it can connect the transparent conductor patterns 200 isolated from each other.

The transparent conductor coating 300 formed on the semiconductor substrate 100 and the transparent conductor patterns 200 may form a surface of the photoelectric element according to the embodiment. Light may be incident in an A direction and transmit through the transparent conductor coating 300 and the transparent conductor patterns 200 to reach the semiconductor substrate 100. The transparent conductor coating 300 and the transparent conductor patterns 200 can significantly reduce the reflection of the incident light.

A height of the transparent conductor coating 300 may be 0.5 times or less than the height of the transparent conductor patterns 200. When the height of the transparent conductor coating 300 is more than 0.5 times the height of the transparent conductor patterns 200, the focusing of the incident light can be hindered due to the structure of the transparent conductor patterns 200.

In addition, when the semiconductor substrate 100 has superior electrical conductivity, the transparent conductor coating 300 can be omitted. This is because electrical conduction, which is a function of the transparent conductor coating 300, can be performed by the semiconductor substrate 100.

Not all of light incident upon the photoelectric element may be transmitted, and some of the incident light may be reflected. As the amount of light that is reflected decreases, more photons may reach a light absorber. The reflection of the incident light is reduced by the transparent conductor patterns 200 of the photoelectric element according to the embodiment due to the structure of the transparent conductor patterns 200. In addition, the reflection of the incident light is further reduced by the transparent conductor coating 300 additionally formed on the transparent conductor patterns 200 as will be understood from experiments which will be described later.

The transparent conductor patterns 200 and the transparent conductor coating 300 of the photoelectric element according to the embodiment may serve as a lens for incident light. Therefore, light may be refracted to be focused on a certain portion. In addition, since the transparent conductor patterns 200 are not a single pattern but a plurality of patterns arranged periodically, a diffraction phenomenon of transmitted light may occur while incident light is refracted by each of the transparent conductor patterns 200.

A focal length of a lens may vary according to the wavelength of light.

$$R = \frac{h^2 + r^2}{2h}, \quad (1)$$

where R is a radius of curvature of the surface of the photoelectric element according to the current embodiment, h is the height of the transparent conductor patterns 200, and r is a radius of a cross-section of a portion, at which the transparent conductor patterns 200 meet the semiconductor substrate 100, taken along an x-y plane.

$$F_{air} = \frac{R}{n_{ITO} - n_{air}}, \quad (2)$$

Where $F_{air}$ is a focal length of a lens made of ITO in an air condition. Here, $n_{ITO}$ is a refractive index of the ITO, and $n_{air}$ is a refractive index in air. R is the radius of curvature of the surface of the photoelectric element according to the current embodiment.

$$F_{Total} = F_{air} \times n_{Si} \quad (3)$$

Where $F_{total}$ is a focal length in the semiconductor substrate 100 in a case where the semiconductor substrate 100 is made of, e.g., Si. $F_{air}$ is a focal length of a lens made of ITO in an air condition, and $n_{si}$ is a refractive index of silicon.

In Equations (1) through (3), the focal length $F_{total}$ is fixed, but $n_{si}$ and $n_{ITO}$ are values that vary according to the wavelength of light. Therefore, the focal length $F_{total}$ varies according to the wavelength of light.

Therefore, the focal length for each wavelength can be adjusted by controlling R according to h and r. Accordingly, the photoelectric element of the current embodiment enables incident light to easily reach the semiconductor substrate 100 by adjusting the focal length. As a result, the conversion efficiency of the photoelectric element can be increased.

Embodiment 1

A p-type silicon wafer was used as a semiconductor substrate. An n-doped region was formed on the semiconductor substrate. Accordingly, it was possible to form a PN junction and a depletion layer. As illustrated in FIGS. 2 through 4, dome-shaped transparent conductor patterns were formed of ITO on the semiconductor substrate. The dome-shaped transparent conductor patterns were isolated from each other. A unit of one transparent conductor pattern has a width of about 360 nm and a height of about 200 nm. The transparent conductor patterns have a period of 575 nm. A transparent conductor coating was formed of ITO to a height of 80 nm on the ITO transparent conductor patterns.

Comparative Example 1

A silicon substrate (bare Si) without transparent conductor patterns and a transparent conductor coating are used as Comparative Example 1.

Comparative Example 2

Comparative Example 2 is the Same as Embodiment 1 Except that a Transparent conductor coating is not formed on transparent conductor patterns.

Comparative Example 3

A transparent conductor film, instead of transparent conductor patterns, was formed of ITO to a height of 280 nm on a silicon substrate. Therefore, the ITO film formed as a single piece, instead of patterns isolated from each other, was formed on the substrate.

Comparative Example 4

A transparent conductor film, instead of transparent conductor patterns, was formed of ITO to a height of 280 nm on a silicon substrate. Therefore, the ITO film formed as a single piece, instead of patterns isolated from each other, was formed on the substrate.

Experimental Example 1

Reflectance with respect to wavelength and weighted reflectance with respect to the incident angle of Embodiment 1 and Comparative Examples 1 through 4 were measured. The reflectance was calculated in the wavelength range of 400 to 1100 nm.

FIGS. 5A-5E illustrate the results of measuring the reflectance and weighted reflectance of Embodiment 1 and Comparative Examples 1 through 4.

Figure 5A:
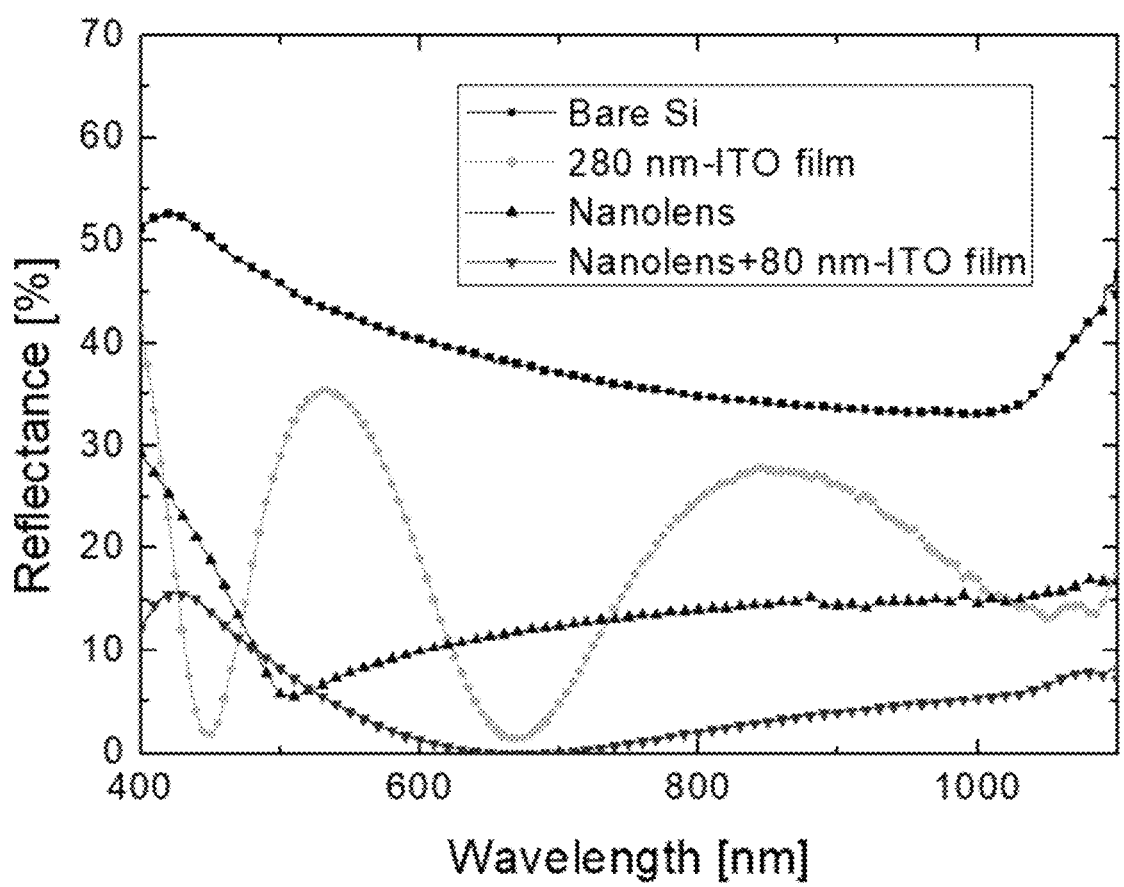
FIGS. 5A-5E illustrate the results of measuring the reflectance and weighted reflectance of Embodiment 1 and Comparative Examples 1 through 4.
Figure 5B:
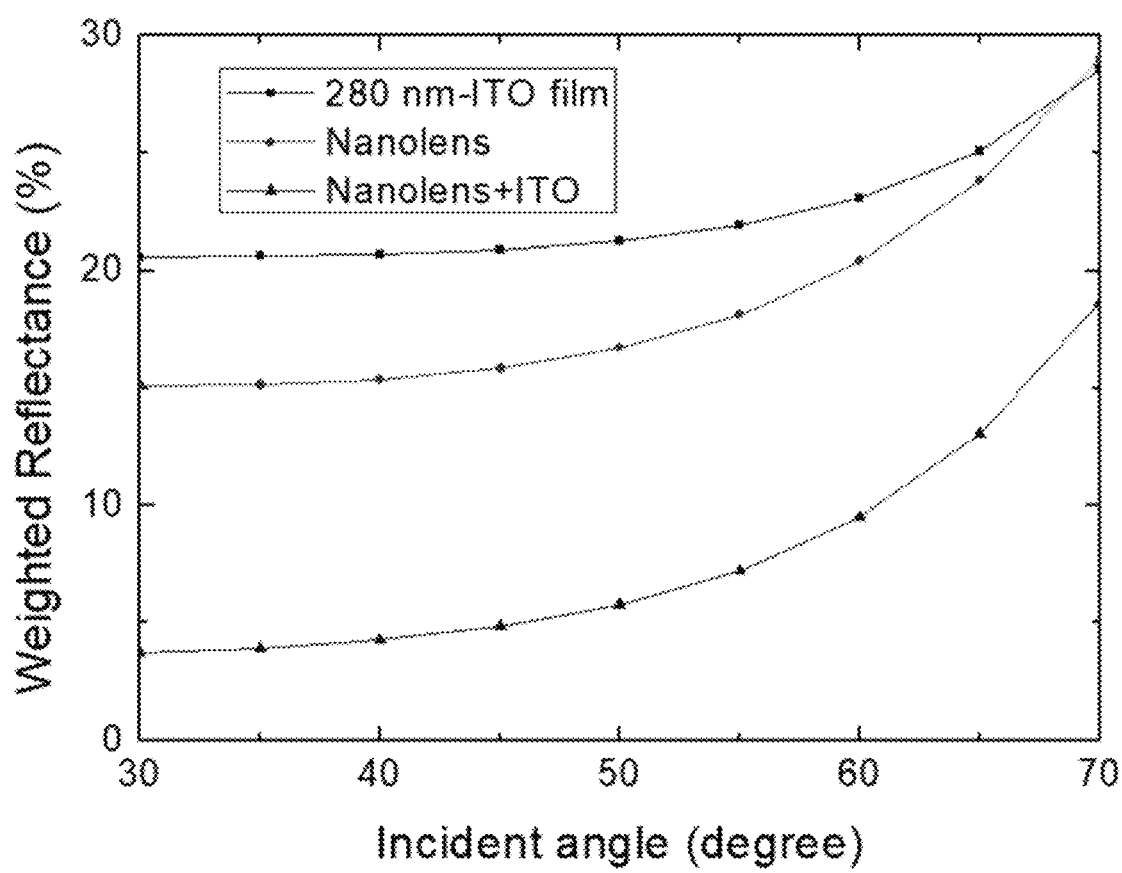

Referring to FIG. 5A, the silicon substrate of Comparative Example 1 has a high reflectance of 38.90%, whereas the silicon substrate of Comparative Example 4 has a low reflectance of 18.63%. Since silicon has a refractive index of 4.1 which is greatly different from a refractive index of 1 of air, reflectance can be significantly reduced by the insertion of an ITO film having a refractive index of 1.9. Comparative Example 2 including patterns instead of a film has a reflectance of 13.85% which is lower than that of Comparative Example 4 including a flat film. However, there is no zero reflection point in Comparative Example 2. This is because the ITO patterns cover not all parts of the semiconductor substrate.

Embodiment 1 has the lowest reflectance of 4.70%. Embodiment 1 is different from Comparative Example 2 in that the additional ITO film having a height of 80 nm covers all parts of the semiconductor substrate, thereby further reducing reflectance. In addition, a very broad near-zero-reflection region (608 to 751 nm) having a reflectance of 1% or less is observed in Embodiment 1. This region is a red and near-infrared (IR) range (600 to 1100 nm).

Also, Embodiment 1 has a very low reflectance in a short-wavelength region compared with Comparative Examples 3 and 4.

Figure 5C:
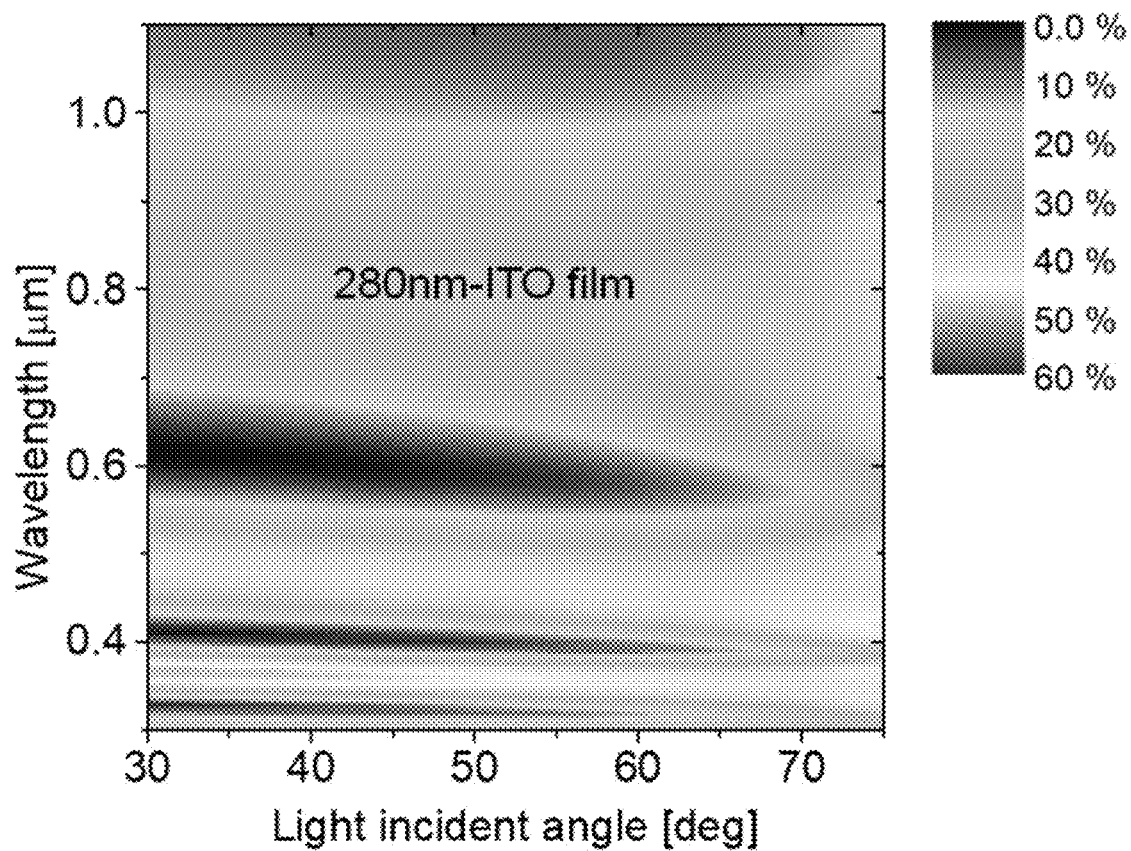
Figure 5D:
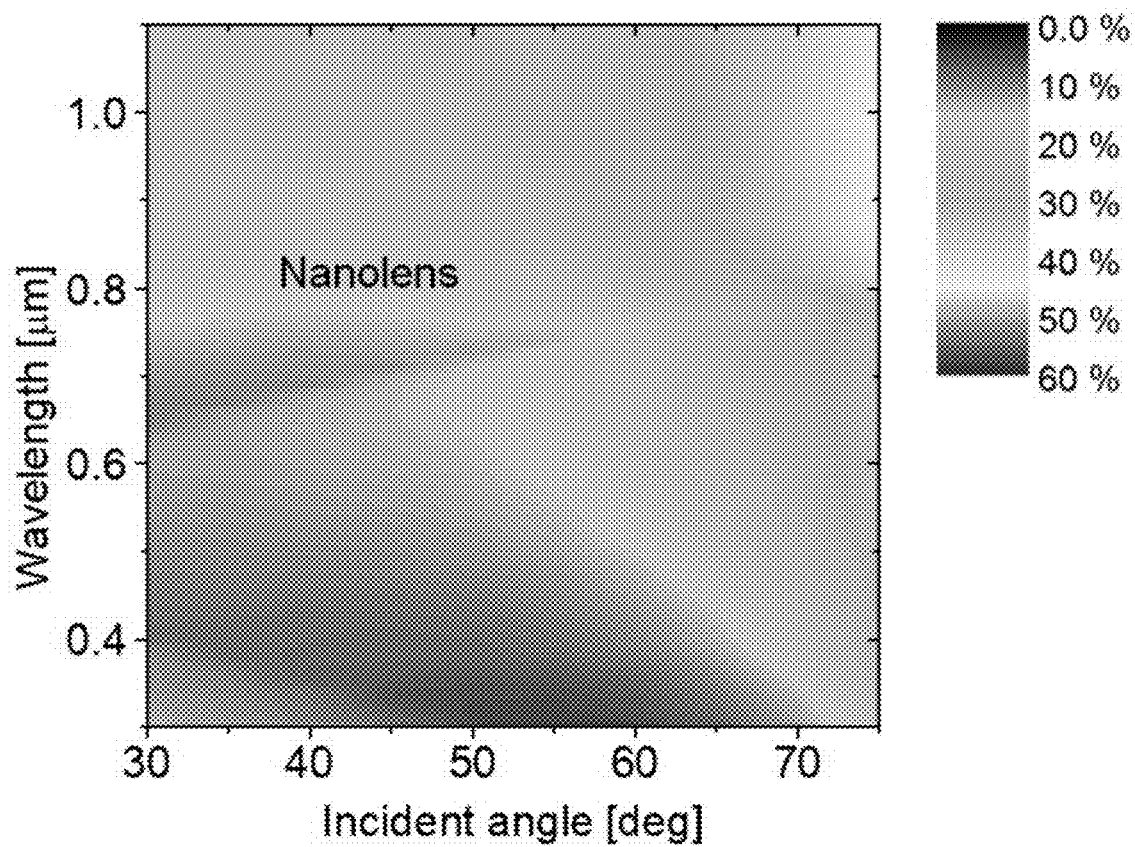
Figure 5E:
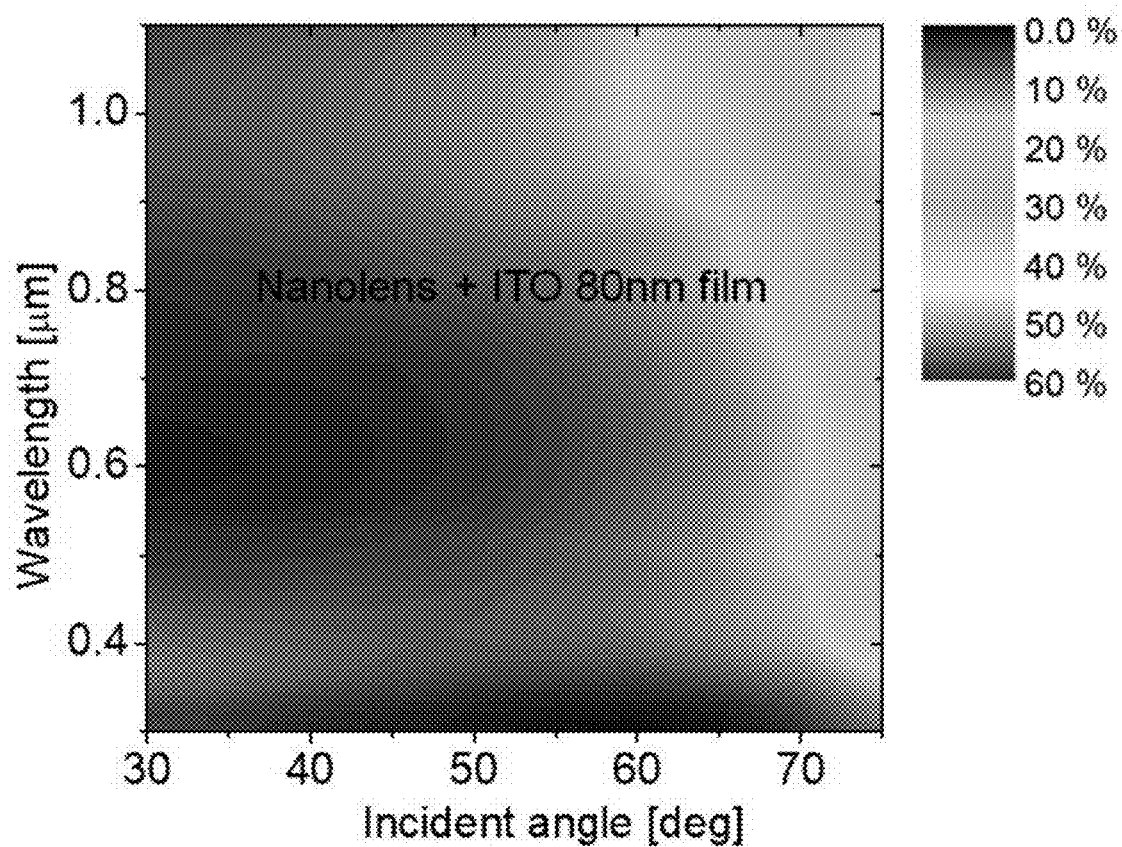

Referring to FIGS. 5C-5E, Embodiment 1 has very low reflectance with respect to incident angle compared with other results.

$$R_W = \frac{\int_{\lambda=400\,nm}^{\lambda=1100\,nm} R(\lambda)\Phi(\lambda)S(\lambda)d\lambda}{\int_{\lambda=4000\,nm}^{\lambda=1100\,nm} \Phi(\lambda)S(\lambda)d\lambda}. \quad (4)$$

Equation (4) is designed to calculate weighted reflectance $R_w$. $R_w$ is weighted reflectance, $R(\lambda)$ is reflectance of monochromatic light, $\Phi(\lambda)$ is an incident photon flux, and $S(\lambda)$ is internal quantum efficiency (IQE).

It may be best for a photoelectric element when the light is incident at a right angle to a substrate. However, the incident angle may vary with different time and location. The photoelectric element according to the embodiment shows similar performance despite the varying incident angle. In particular, the photoelectric element according to the embodiment has a significant advantage in that it has a very broad zero-reflection region.

Experimental Example 2

Focal length and electric field with respect to the wavelength of Embodiment 1 and Comparative Examples 1 through 4 will now be described with reference to FIGS. 6 and 7.

Figure 6:
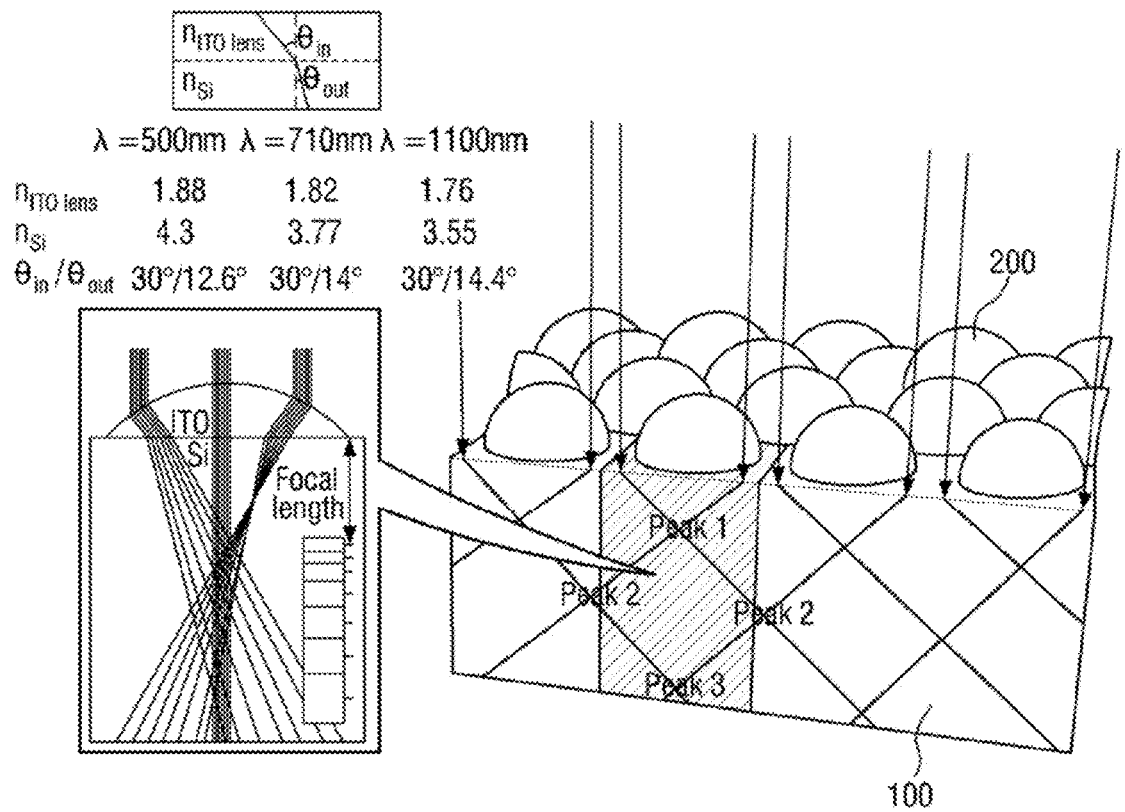
FIG. 6 illustrates the focal length with respect to wavelength of a photoelectric element according to an embodiment.

Referring to FIG. 6, transparent conductor patterns and a transparent conductor coating may serve as a lens. Therefore, the focal length of the lens may be adjusted to focus incident light on a light absorber, thereby increasing conversion efficiency.

In Equation (1), h=200 nm, r=180 nm, and R=181 nm. In addition, according to Equations (2) and (3), the value of $F_{total}$ varies according to wavelength.

TABLE 1

| Wavelength [nm] | $n_{ITO}$ | $F_{air}$ [nm] | $n_{Si}$ | $F_{total}$ [nm] |
|---|---|---|---|---|
| 400 | 2.12 | 161.6 | 5.57 | 900.1 |
| 500 | 1.88 | 205.6 | 4.29 | 882.3 |
| 600 | 1.85 | 212.9 | 3.9 | 830.5 |
| 710 | 1.82 | 220.7 | 3.77 | 832.2 |
| 1100 | 1.76 | 238.1 | 3.54 | 843.1 |

Table 1 shows values of refractive index and focal length according to wavelength. Based on the above information, a propagation profile of incident light from ITO to Si can be calculated using Snell's law. When the wavelength is changed while the incident angle is fixed, an angle of reflection varies according to the wavelength.

Figure 7:
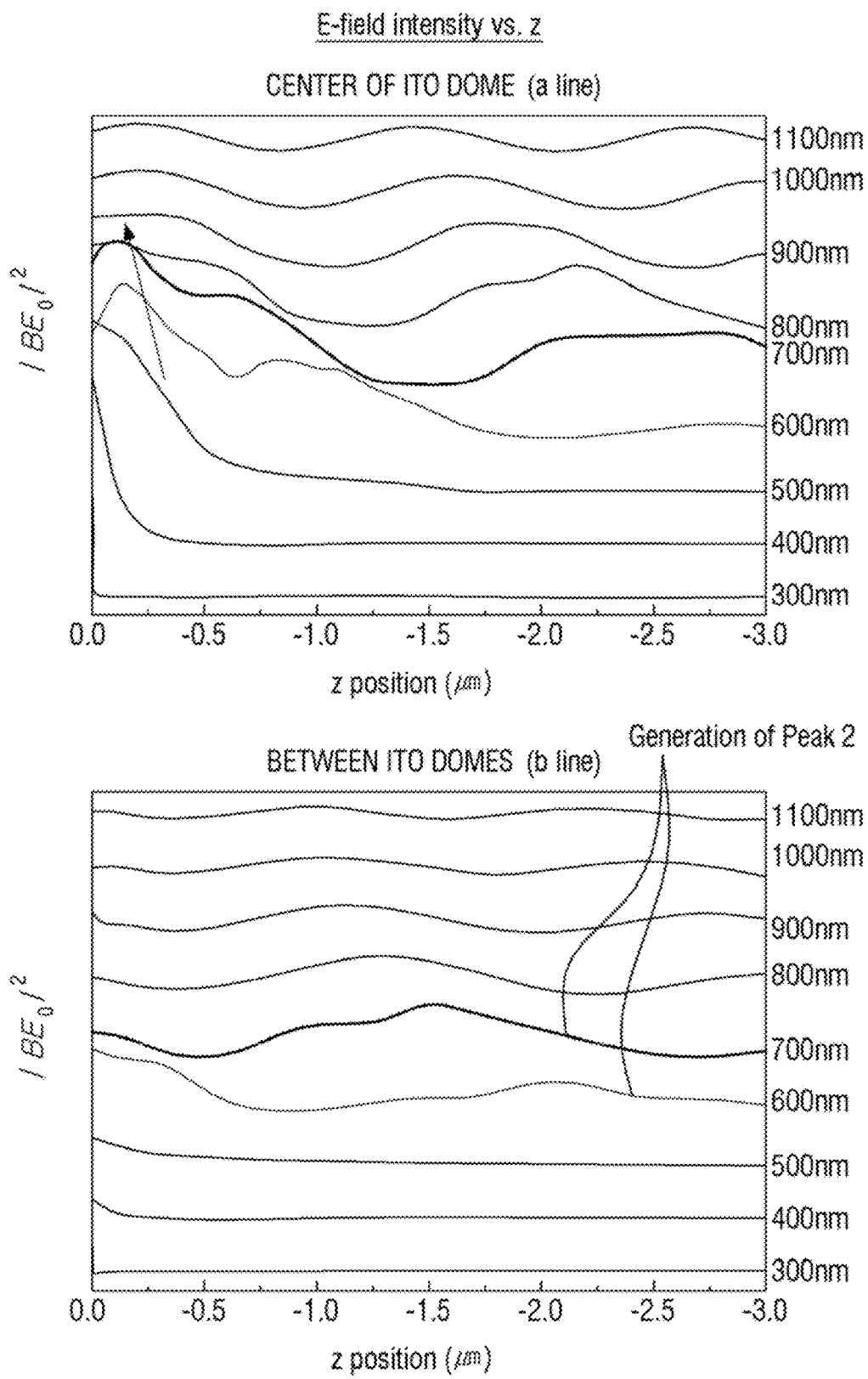
FIG. 7 illustrates the results of measuring an electric field with respect to wavelength of a photoelectric element according to an embodiment and photoelectric elements according to comparative examples.

FIG. 7 illustrates the distribution of an electric field by Finite Difference Time Domain (FDTD) and the profile of the electric field in an 'a' line and a 'b' line. The magnitude ($|E/E_o|^2$) of the electric field sharply decreases as the distance from the surface increases, but $E_x/E_o$ and $E_z/E_o$ have certain patterns.

Referring to the profile of the electric field in a Z direction in the 'a' line and the 'b' line, the electric field becomes more intense due to the diffraction phenomenon (peaks 1, 2 and 3). The fact that the electric field becomes more intense in the 'a' line clearly indicates that the transparent conductor patterns are serving as a lens.

Referring to Table 1, the intensity of the electric field may be controlled by two factors. The first factor is that since silicon has a high absorption coefficient ($\alpha_{si}$) at a short wavelength, the electric field is rapidly attenuated in the silicon. The second factor is that as the wavelength of a visible light region increases, the focal length of the transparent conductor patterns as a lens is gradually reduced due to a reduction in the refractive index of the silicon.

However, since the photoelectric element according to the embodiment is not a single pattern but a plurality of patterns arranged periodically, the diffraction phenomenon occurs within the semiconductor substrate. As a result, areas (such as peaks 2 and 3) in which light is focused are created.

Referring to FIG. 7, at a short wavelength (500 nm), peak 1 is most predominant, and peaks 2 and 3 do not exist. Peak 1 may be located near the light absorber. Therefore, a photoelectric element having high conversion efficiency can be provided. This is possible due to a high absorption coefficient ($\alpha_{si}$) of silicon.

While peaks 1 through 3 are all observable at a long wavelength (1100 nm), it is not clear which of peaks 1 through 3 is predominant at the long wavelength. However, it can be seen that the inducement to the light absorber is far higher in Embodiment 1 than in Comparative Examples 3 and 4.

Experimental Example 3

Current and current density with respect to voltage, internal IQE performance with respect to wavelength and relative IQE with respect to the wavelength of Embodiment 1 and Comparative Example 4 were measured.

Figure 8:
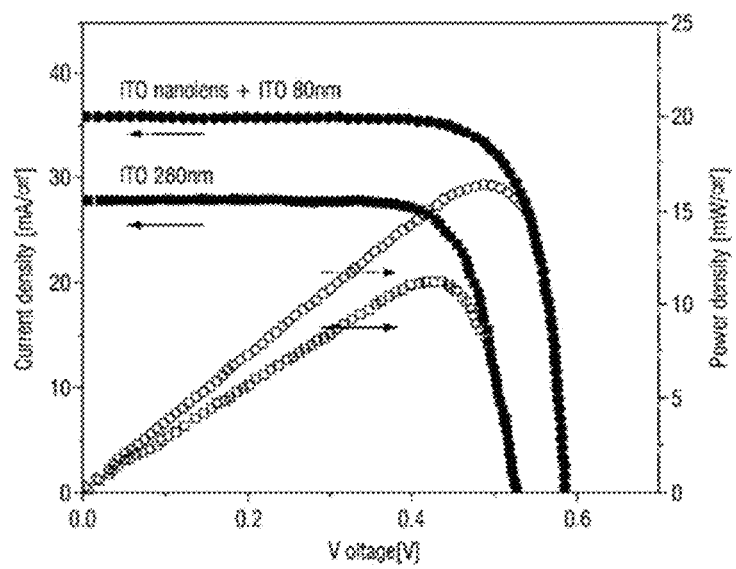
FIG. 8 is a graph illustrating current and current density values with respect to voltage of a photoelectric element according to an embodiment and photoelectric elements according to comparative examples.
Figure 9:
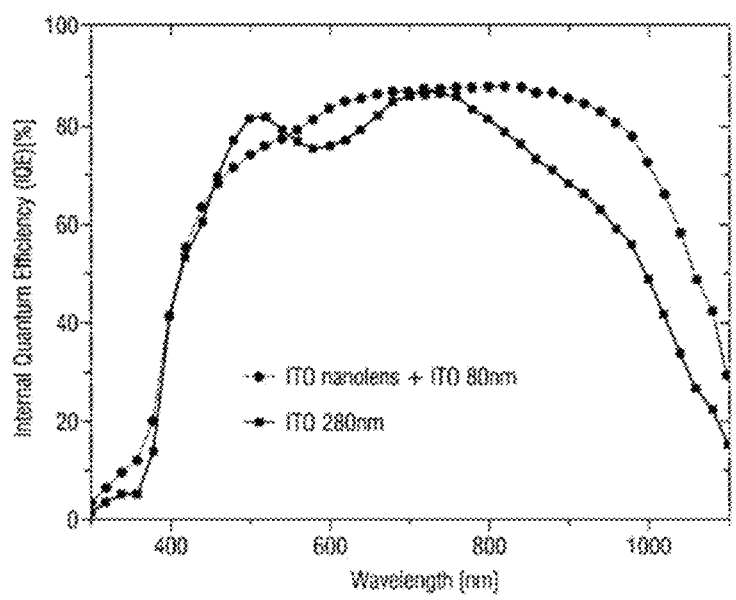
FIG. 9 is a graph illustrating internal quantum efficiency (IQE) values with respect to wavelength of a photoelectric element according to an embodiment and photoelectric elements according to comparative examples.
Figure 10:
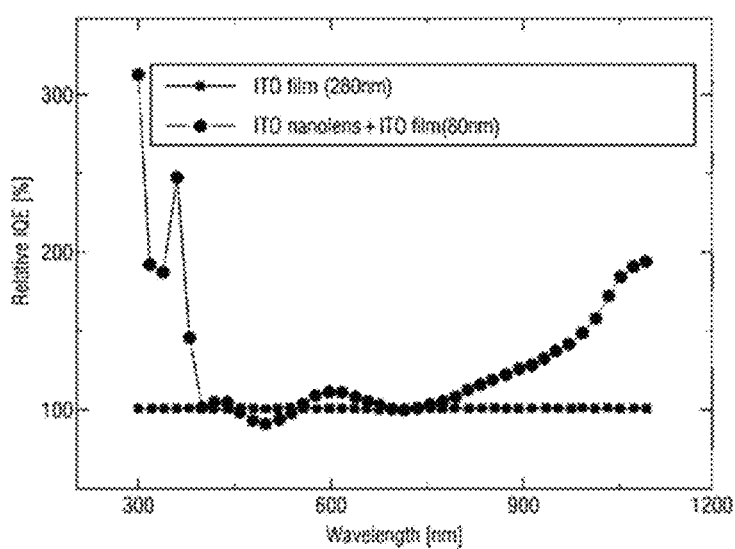
FIG. 10 is a graph illustrating relative IQE values with respect to wavelength of a photoelectric element according to an embodiment and photoelectric elements according to comparative examples.

The photoelectric element according to the embodiment will be compared with Comparative Example 4 by referring to FIGS. 8 through 10. FIG. 8 is a graph illustrating current and current density values with respect to the voltage of a photoelectric element according to an embodiment and photoelectric elements according to comparative examples. FIG. 9 is a graph illustrating IQE values with respect to the wavelength of a photoelectric element according to an embodiment and photoelectric elements according to comparative examples. FIG. 10 is a graph illustrating relative IQE values with respect to the wavelength of a photoelectric element according to an embodiment and photoelectric elements according to comparative examples. In FIG. 8, the filled circle represents the current density of Embodiment 1, and the filled rectangle represents the current density of Comparative Example 4. In FIG. 8, the hollow circle represents the power density of the Embodiment 1, and the hollow square represents the power density of the Comparative Example 4.

Referring to FIG. 8, Embodiment 1 has an open circuit voltage of 590 mV and a short circuit current of 35.8 mA/cm² which are higher than 520 mV and 27.8 mA/cm² of Comparative Example 4 by 16% and 10.9%, respectively.

Referring to FIG. 9, the photoelectric element of Embodiment 1 has higher IQE in a wide wavelength range than the photoelectric element of Comparative Example 4. It can be understood from the relative quantification of the IQE in FIG. 9 that a graph of the photoelectric element of Embodiment 1 is located higher than a graph of the photoelectric element of Comparative Example 4. In particular, the IQE of the photoelectric element of Embodiment 1 is higher than that of the photoelectric element of Comparative Example 4 by 313% at a short wavelength of 300 nm and by 193.8% at a long wavelength of 1100 nm.

Hereinafter, a method for manufacturing a photoelectric element according to an embodiment will be described with reference to FIGS. 11 through 17. A redundant description of elements and features identical to those of the photoelectric element according to the above-described embodiment will be omitted or given briefly.

Figure 11:
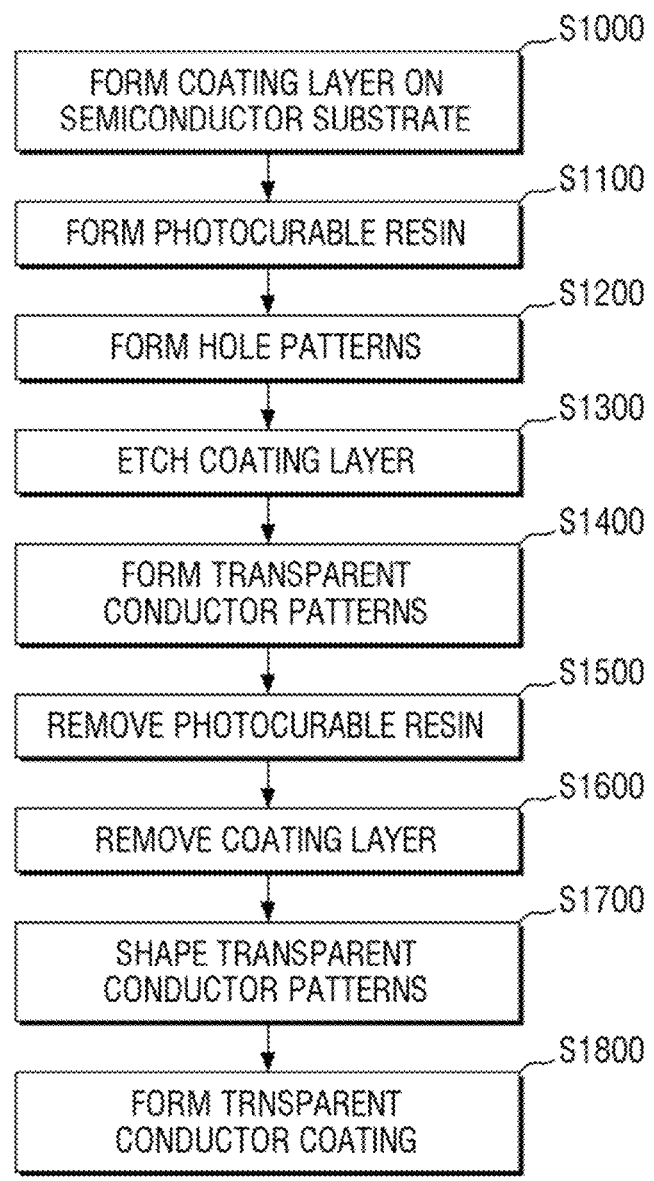
FIG. 11 is a flowchart illustrating a method for manufacturing a photoelectric element according to an embodiment.
Figure 13:
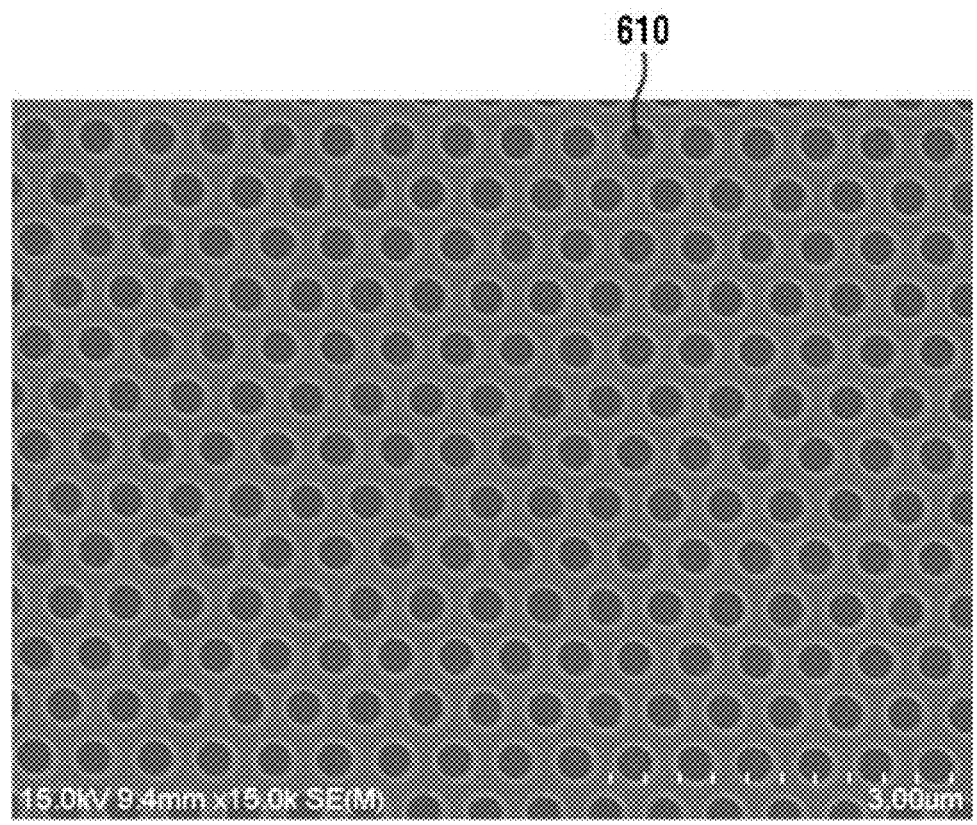
Figure 14:
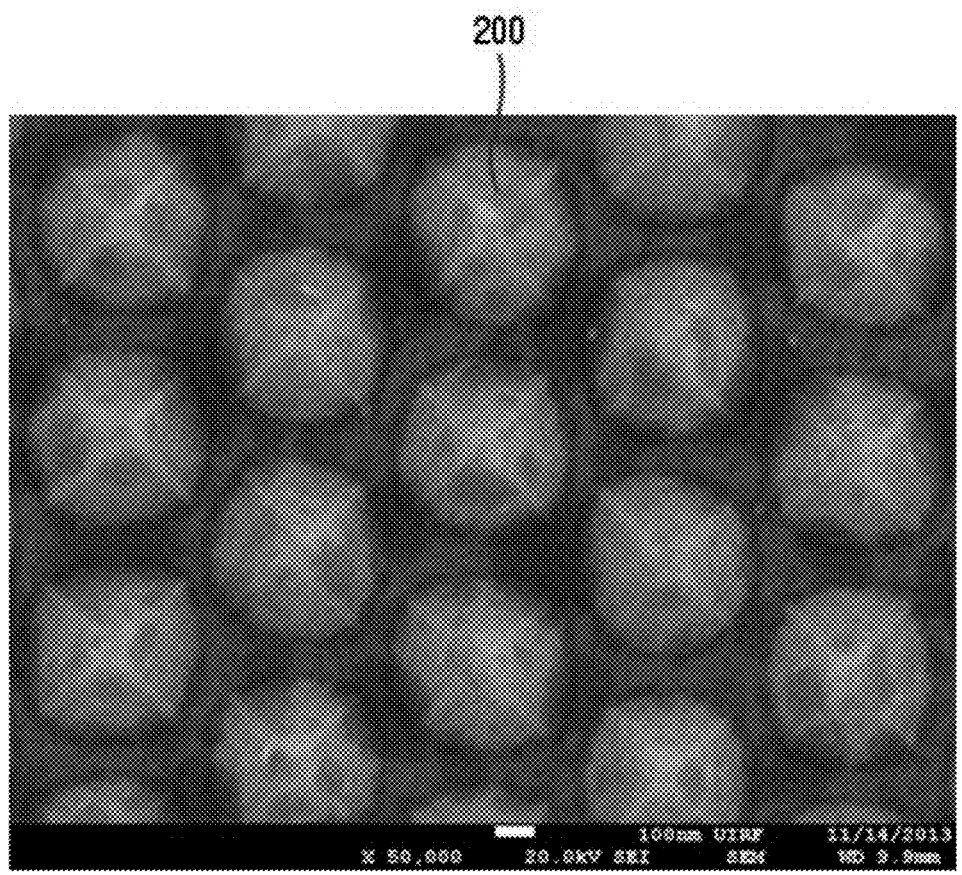
Figure 15:
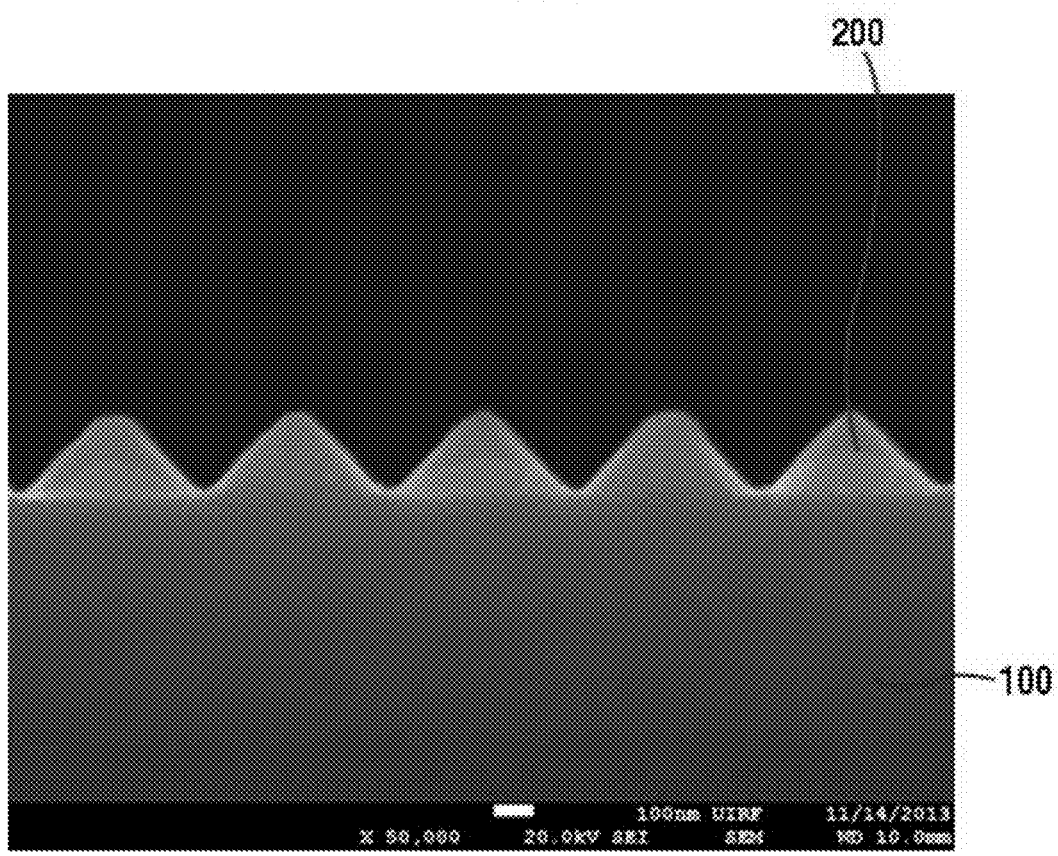
Figure 16:
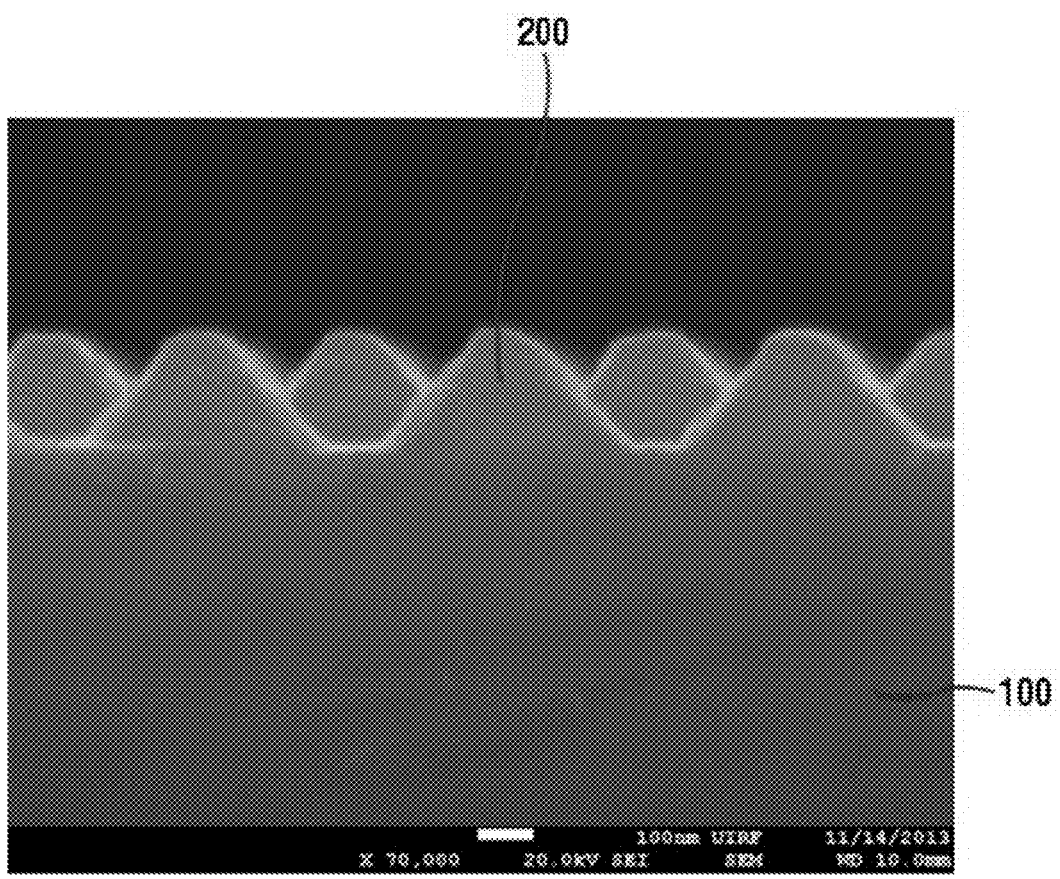
Figure 17:
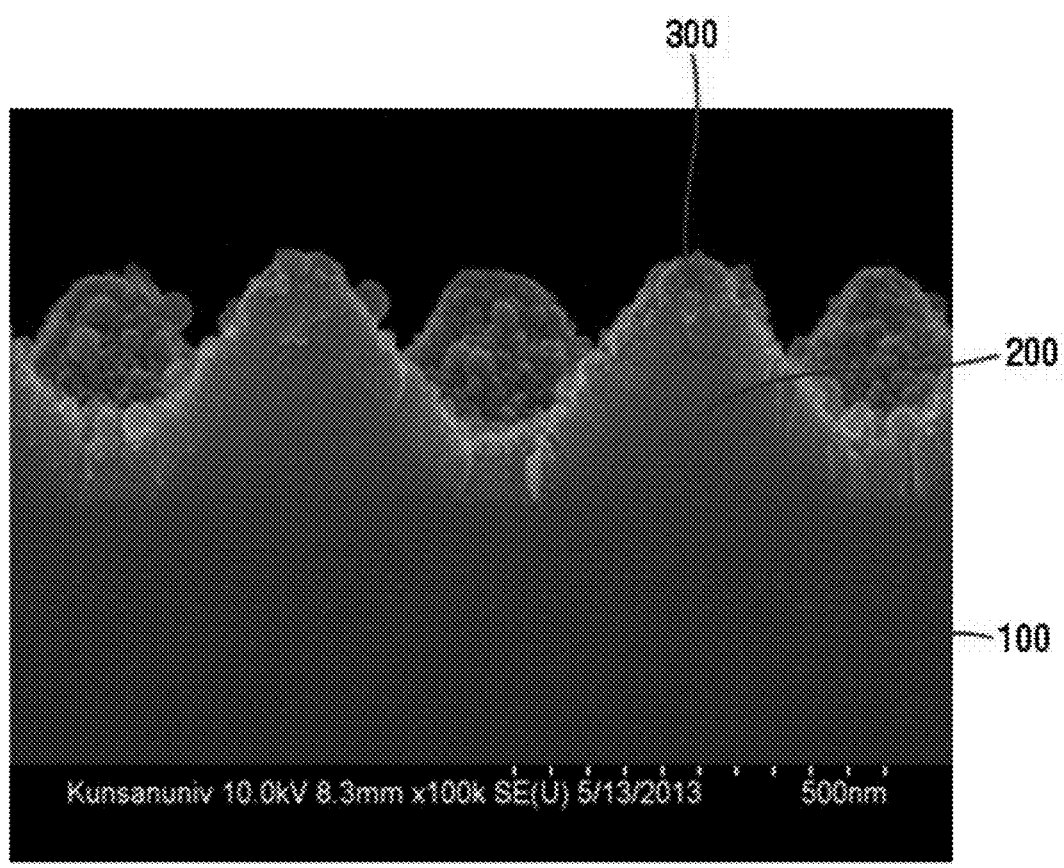

FIG. 11 is a flowchart illustrating a method for manufacturing a photoelectric element according to an embodiment. FIGS. 12 through 17 are views illustrating detailed operations of the method for manufacturing a photoelectric element according to the embodiment. Specifically, FIGS. 13 and 14 are plan views illustrating operations of the method for manufacturing a photoelectric element according to the embodiment, and FIGS. 15 through 17 are side views illustrating the operations of the method for manufacturing a photoelectric element according to the embodiment.

Referring to FIG. 11, a coating layer is formed on a semiconductor substrate (operation S1000).

Figure 12:
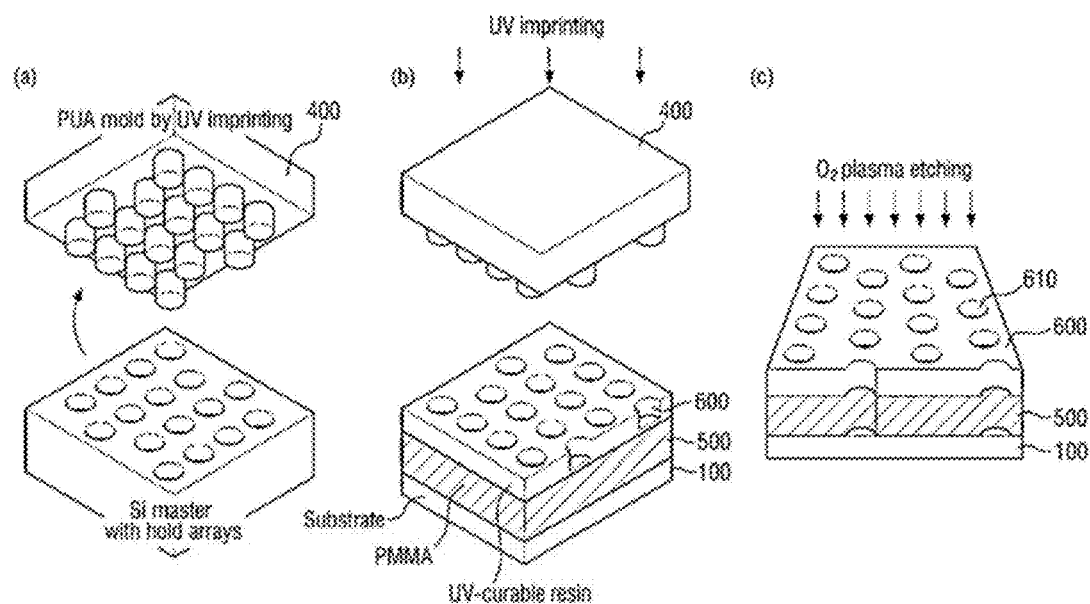
FIGS. 12 through 17 are views illustrating operations of the method for manufacturing a photoelectric element according to the embodiment.

Specifically, referring to (b) of FIG. 12, a coating layer 500 is formed on a surface of a semiconductor substrate 100. The coating layer 500 is not particularly limited but may be made of polymethyl methacrylate (PMMA). A height of the coating layer 500 is not limited to a particular height but may be in the range of, e.g., 100 to 800 nm. The height of the coating layer 500 may correspond to a height of transparent conductor patterns 200 which will be formed later.

Referring back to FIG. 11, the photocurable resin is formed on the coating layer (operation S1100).

Specifically, referring to (b) of FIG. 12, photocurable resin 600 is formed. The photocurable resin 600 may be a material used in a nanoimprinting or UV imprinting process. The photocurable resin 600 may be cured by light.

Referring back to FIG. 11, hole patterns are formed (operation S1200).

Specifically, referring to FIG. 12, holes may be formed by pressing a pre-produced mold 400 against the photocurable resin 600. The mold 400 is not particularly limited but may be made of polyurethane acrylate (PUA). The mold 400 may be made of a transparent material through which light can pass. Hole patterns 610 may be intaglio patterns corresponding to embossed patterns formed on the mold 400 with a specific period. That is, the hole patterns 610 may be a hole array having the same period as the embossed patterns formed on the mold 400.

After the holes are formed in the photocurable resin 600 by pressing the mold 400 against the photocurable resin 600, UV light may be irradiated to cure the photocurable resin 600. The UV light may transmit through the mold 400 to reach the photocurable resin 600. The hole patterns 610 may be formed of the photocurable resin 600 by the irradiation of the UV light. The photocurable resin 600 remaining in the hole patterns 610 may be removed by, but not limited to, $CF_4$ and $O_2$ plasma etching.

Referring back to FIG. 11, the coating layer is etched (operation S1300).

Referring to (c) of FIG. 12, the coating layer 500 may be exposed by the hole patterns 610. Portions of the coating layer 500 which are exposed by the hole pattern 610 may be etched. Here, the coating layer 500 may be etched using, but not limited to, $O_2$ reactive ion etching (RIE). Referring to FIG. 13, the coating layer 500 may be etched to form the same array as the hole patterns 610. The etching of the coating layer 500 may expose the semiconductor substrate 100. A period and a diameter shown in FIG. 13 are merely example values.

Referring back to FIG. 11, transparent conductor patterns are formed (operation S1400).

Referring to FIGS. 14 through 17, transparent conductor patterns 200 may be formed on the semiconductor substrate 100. The transparent conductor patterns 200 may be isolated from each other with a specific period. The transparent conductor patterns 200 may be conductors made of a transparent material that can pass visible light. For example, the transparent conductor patterns 200 may be, but are not limited to, tin oxide, indium oxide, Pt, Au, IZO, or ITO.

The transparent conductor patterns 200 may be formed by, but not limited to, a sputtering method, a liquid method, or an e-beam evaporator using an electron beam.

The shape of the transparent conductor patterns 200 may be completed in S1400. However, the inventive concept is not limited thereto. That is, the shape of the transparent conductor patterns 200 may also not be completed in this operation. The transparent conductor patterns 200 may later be shaped once again in operation S1700 to have a structure that efficiently transmits and focuses light. The shaping of the transparent conductor patterns 200 will be described later.

Referring back to FIG. 11, the photocurable resin and the coating layer are removed (operations S1500 and S1600).

The photocurable resin 600 and the coating layer 500 may be removed by a lift-off process. The photocurable resin 600 and the coating layer 500 may be removed using, but not limited to, an acetone solution and ultrasonic waves.

Referring to FIGS. 11 and 14 through 16, the transparent conductor patterns are shaped (operation S1700).

The shape of the transparent conductor patterns 200 is not limited to a particular shape but may be a semicircular shape, an oval shape, a trapezoidal shape, a pyramid shape, a triangular shape, or a pillar shape. In particular, the transparent conductor patterns 200 may have a semicircular shape, that is, may become gradually narrower from the bottom toward the top in order to reduce light reflectance.

A horizontal cross-sectional shape of the transparent conductor patterns 200 is not limited to a particular shape and may be, for example, a circular shape or a polygonal shape. The term "polygonal shape" encompasses all of a triangular shape, a quadrilateral shape, a pentagonal shape, a hexagonal shape, a heptagonal shape, an octagonal shape, etc. Each side of the polygonal shape may or may not be equal. The polygonal shape may be a circular shape in order to prevent light reflectance from being dependent on direction.

The transparent conductor patterns 200 can be arranged in any form as long as they are a plurality of patterns with a specific period. In an example, the transparent conductor patterns 200 may be arranged in a matrix form. Here, a period in an x-axis direction and a period in a y-axis direction may be the same or different. When the transparent conductor patterns 200 are arranged in a matrix form, a maximum of eight transparent conductor patterns 200 can be placed adjacent to one transparent conductor pattern 200. For example, when the period in the x-axis direction and the period in the y-axis direction are the same, four transparent conductor patterns 200 adjacent to one transparent conductor pattern 200 in the axis directions are located at equal distances from the one transparent conductor pattern 200. and four transparent conductor patterns 200 located diagonally to the axis directions are at equal distances from the one transparent conductor pattern 200 and are located further away from the one transparent conductor pattern 200 than the transparent conductor patterns 200 adjacent to the one transparent conductor pattern 200 in the axis directions.

A width of the transparent conductor patterns 200 is not limited to a particular width but may be in the range of, e.g., 100 to 1000 nm. The transparent conductor patterns 200 having a width of less than 100 nm are difficult to manufacture. In addition, the transparent conductor patterns 200 having a too small width may reduce the light control capability of a photoelectric element, thus increasing a light scattering effect rather than a light focusing effect. Therefore, the width of the transparent conductor patterns 200 may be 100 nm or more. In addition, the transparent conductor patterns 200 having a width of more than 100 nm can degrade the light control capability of the photoelectric element.

A height of the transparent conductor patterns 200 is not limited to a particular height but may be in the range of, e.g., 100 to 800 nm. The transparent conductor patterns 200 having a height of less than 100 nm are undesirable due to insufficient electrical conductivity. In addition, the transparent conductor patterns 200 having a height of more than 800 nm are undesirable due to not high transmittance of incident light.

A period of the transparent conductor patterns 200 denotes a cycle at which the transparent conductor pattern 200 is formed repeatedly. The period also denotes a distance between central axes of adjacent transparent conductor patterns 200. Therefore, the period of the transparent conductor patterns 200 is greater than the width of the transparent conductor patterns 200.

Specifically, since the transparent conductor patterns 200 are isolated from each other, the period of the transparent conductor patterns 200 should be greater than the width of the transparent conductor patterns 200. This is because the transparent conductor patterns 200 cannot be isolated from each other when the width of the transparent conductor patterns 200 is greater than the period of the transparent conductor patterns 200.

The period of the transparent conductor patterns 200 is not limited to a particular period but may be in the range of 1.2 to 5 times the width of the transparent conductor patterns 200. When the period of the transparent conductor patterns 200 is less than 1.2 times the width of the transparent conductor patterns 200, the transparent conductor patterns 200 isolated from each other can contact each other due to a cause related to a process. This can cause a structural problem and reduce the reliability of the photoelectric element. In addition, when the period of the transparent conductor patterns 200 is more than 5 times the width of the transparent conductor patterns 200, the efficiency versus area of the photoelectric element can be reduced.

Referring to FIGS. 11 and 17, a transparent conductor coating is formed (operation S1800).

Referring to FIG. 17, a transparent conductor coating 300 may be formed on the transparent conductor patterns 200, but the inventive concept is not limited thereto. The transparent conductor coating 300 may be made of the same material as the transparent conductor patterns 200. The transparent conductor coating 300 may be a conductor made of a transparent material that can pass visible light. For example, the transparent conductor coating 300 may be, but is not limited to, tin oxide, indium oxide, Pt, Au, IZO, or ITO.

The transparent conductor coating 300 and the transparent conductor patterns 200 can also be made of different materials. Both the transparent conductor coating 300 and the transparent conductor patterns 200 should have electrical conductivity and light-transmitting properties on the semiconductor substrate 100. However, a material having superior light-transmitting properties may be advantageous to the transparent conductor patterns 200, and a material having good electrical conductivity may be advantageous to the coating layer 300. Therefore, the conductor coating 300 and the transparent conductor patterns 200 can be made of the same or different materials based on the assumption that at least a minimum level of electrical conductivity and light-transmitting properties is secured for the conductor coating 300 and the transparent conductor patterns 200.

The transparent conductor coating 300 may electrically connect the transparent conductor patterns 200 isolated from each other. Since the transparent conductor coating 300 is formed on the semiconductor substrate 100 as a single piece, it can connect the transparent conductor patterns 200 isolated from each other.

The transparent conductor coating 300 formed on the semiconductor substrate 100 and the transparent conductor patterns 200 may form a surface of a photoelectric element according to an embodiment. Light may be incident in an A direction and transmit through the transparent conductor coating 300 and the transparent conductor patterns 200 to reach the semiconductor substrate 100. The transparent conductor coating 300 and the transparent conductor patterns 200 can significantly reduce the reflection of the incident light.

A height of the transparent conductor coating 300 may be 0.5 times or less than the height of the transparent conductor patterns 200. When the height of the transparent conductor coating 300 is more than 0.5 times the height of the transparent conductor patterns 200, the focusing of the incident light can be hindered due to the structure of the transparent conductor patterns 200.

In addition, when the semiconductor substrate 100 has superior electrical conductivity, the transparent conductor coating 300 can be omitted. This is because electrical conduction, which is a function of the transparent conductor coating 300, can be performed by the semiconductor substrate 100. For example, the transparent conductor coating 300 can be formed only when the surface resistance of the semiconductor substrate 100 is 50 ohm/cm$^2$ or more.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

The invention claimed is:

1. A photoelectric element comprising:
a semiconductor substrate; and
transparent conductor pattern portions formed on a surface of the semiconductor substrate to be connected to each other with a specific period,
wherein the transparent conductor pattern portions comprise:
transparent conductor patterns isolated from each other with a period and
a transparent conductor coating formed on the transparent conductor patterns and being directly contact with the transparent conductor patterns,
wherein a horizontal cross-sectional area of the transparent conductor pattern decreases as the distance from the semiconductor substrate increases,
wherein the transparent conductor coating covers a top surface of the transparent conductor patterns entirely,
wherein a lower surface of the transparent conductor pattern is flat and an upper surface of the transparent conductor pattern is convex upward,
wherein the semiconductor substrate comprises a first conductivity type region, a second conductivity type region on the first conductivity type region and a depletion layer between the first conductivity type region and the second conductivity type region, wherein a first conductivity type of the first conductivity type region is different with a second conductivity type of the second conductivity type region, wherein the second conductivity type region is directly contacted with the transparent conductor patterns, wherein the second conductivity type region is electrically connected to the transparent conductor patterns, and wherein a cross-sectional area of the transparent conductor pattern decreases as a height increases.

2. The photoelectric element of claim 1, wherein a height of the transparent conductor coating is 0.5 times or less than a height of the transparent conductor patterns.

3. The photoelectric element of claim 1, wherein a width of the transparent conductor patterns is in the range of 100 to 1000 nm.

4. The photoelectric element of claim 1, wherein the period of the transparent conductor patterns is greater than the width of the transparent conductor patterns.

5. The photoelectric element of claim 1, wherein the period of the transparent conductor patterns is in the range of 1.2 to 1.5 times the width of the transparent conductor patterns.

6. The photoelectric element of claim 1, wherein the height of the transparent conductor patterns is in the range of 100 to 800 nm.

7. The photoelectric element of claim 1, wherein the transparent conductor patterns are made of a different material from the transparent conductor coating.

8. The photoelectric element of claim 1, wherein the transparent conductor patterns comprise at least one of indium tin oxide (ITO), aluminum zinc oxide (AZO), tin oxide, indium oxide, platinum (Pt), gold (Au), and indium zinc oxide (IZO).

9. The photoelectric element of claim 1, wherein the semiconductor substrate comprises at least one of silicon (Si), germanium (Ge), and gallium arsenide (GaAs).

* * * * *